United States Patent [19]

Pierce et al.

[11] Patent Number: 4,490,737
[45] Date of Patent: Dec. 25, 1984

[54] SMOOTH GLASS INSULATING FILM OVER INTERCONNECTS ON AN INTEGRATED CIRCUIT

[75] Inventors: John M. Pierce, Palo Alto; William I. Lehrer, Los Altos, both of Calif.

[73] Assignee: Fairchild Camera & Instrument Corp., Mountain View, Calif.

[21] Appl. No.: 362,322

[22] Filed: Mar. 26, 1982

Related U.S. Application Data

[63] Continuation-in-part of Ser. No. 243,988, Mar. 16, 1981, abandoned.

[51] Int. Cl.³ .................... H01L 23/30; H01L 29/34; C03C 3/04
[52] U.S. Cl. .................. 357/73 AJJ; 357/54; 501/55; 501/63
[58] Field of Search .............. 357/54, 73; 501/55, 501/63

[56] References Cited

U.S. PATENT DOCUMENTS

| | | | |
|---|---|---|---|
| 4,156,250 | 5/1979 | Trap | 357/73 |
| 4,271,582 | 6/1981 | Shirai et al. | 357/73 |
| 4,339,173 | 7/1982 | Aggarwal et al. | 350/96.30 |
| 4,365,264 | 12/1982 | Mukai et al. | 357/54 |

FOREIGN PATENT DOCUMENTS

53-79382  7/1978  Japan ................ 357/54 G

*Primary Examiner*—Mark Bell
*Attorney, Agent, or Firm*—Kenneth Olsen; Carl L. Silverman; Alan H. MacPherson

[57] ABSTRACT

A low temperature insulating glass for use in semiconductor devices comprises a mixture of germanium, silicon, oxygen and phosphorus. In the preferred embodiment, the glass comprises a mixture of about 40% to 55% silicon dioxide ($SiO_2$), about 55% to 40% of germanium dioxide ($GeO_2$) and from 1% to about 5% of phosphorus pentoxide ($P_2O_5$), by mole percent.

6 Claims, 3 Drawing Figures

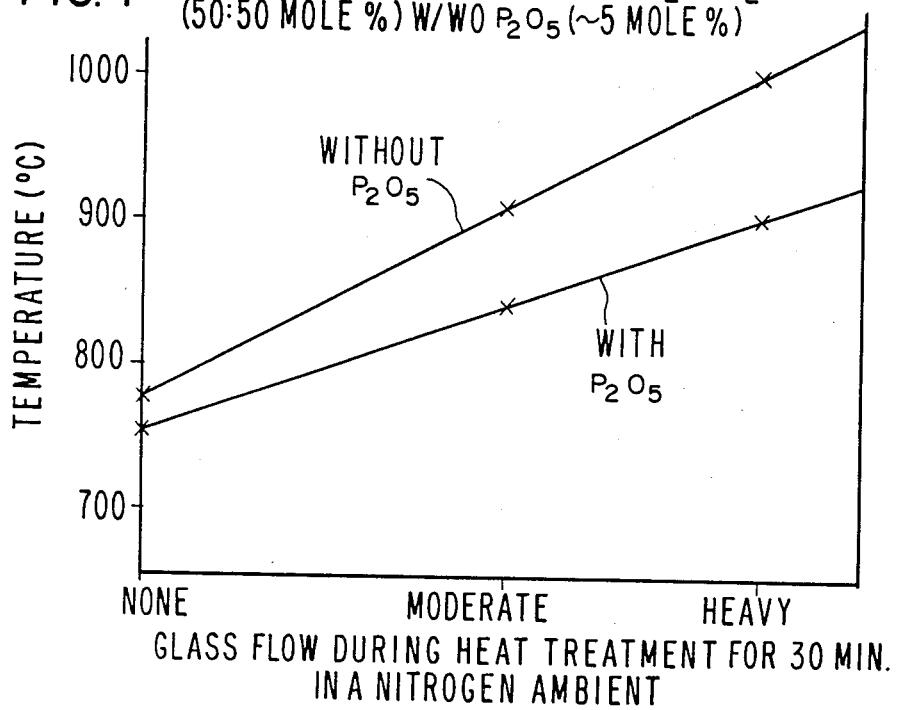
FIG. 1 FLOW CHARACTERISTICS FOR $SiO_2 GeO_2$ (50:50 MOLE %) W/WO $P_2O_5$ (~5 MOLE %)
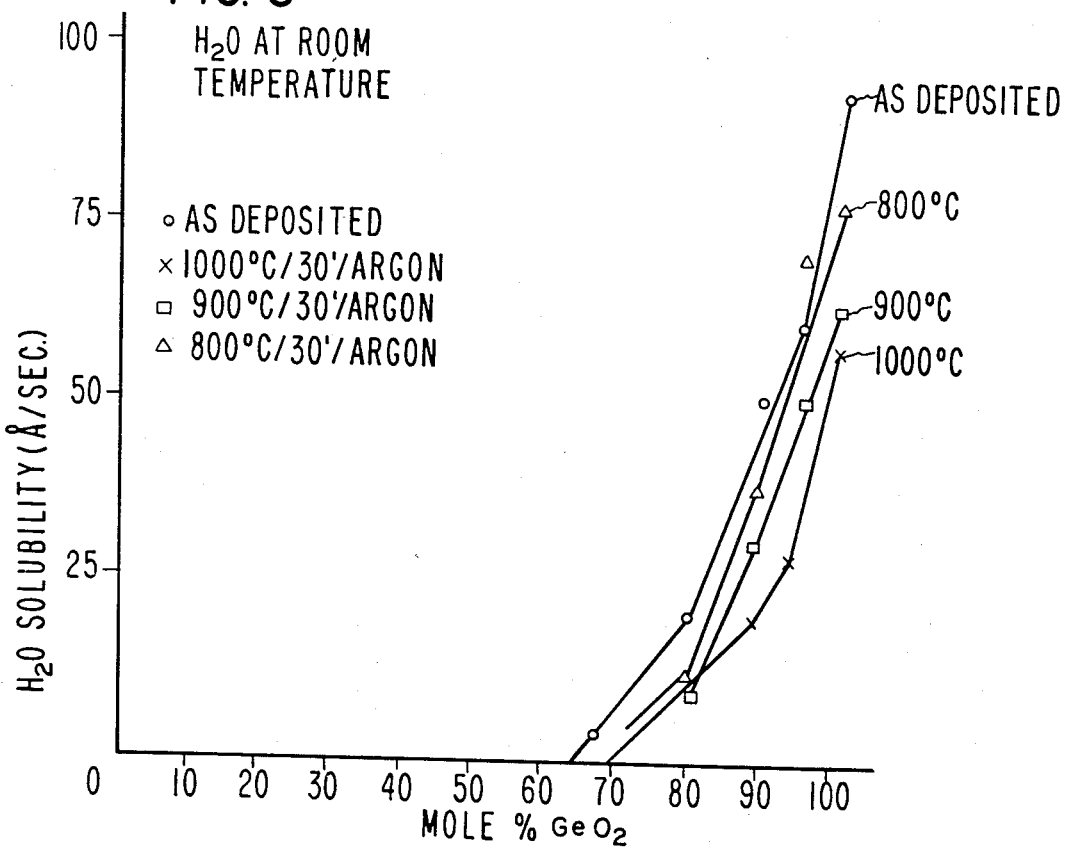
FIG. 3

SMOOTH GLASS INSULATING FILM OVER INTERCONNECTS ON AN INTEGRATED CIRCUIT

RELATED APPLICATION

This is a continuation-in-part of application Ser. No. 06/243,988 filed Mar. 16, 1981, now abandoned.

BACKGROUND OF THE INVENTION

1. Field of the Invention

This invention relates to integrated circuits and in particular to such circuits wherein a glass film with a smooth surface is provided on the integrated circuit over the interconnect structure on the integrated circuit. This invention is particularly useful when the interconnect structure is aluminum or an alloy of aluminum but can also be used advantageously with other interconnect materials such as polycrystalline silicon ("polysilicon") selectively doped to a desired conductivity, or a polysilicide.

2. Description of the Prior Art

The use of glass films overlying aluminum interconnections on integrated circuits is well known. Unfortunately, because prior art glass films flow at a temperature significantly above that of the aluminum, once such a glass film is formed, the topography of the surface of the glass film is permanently fixed. Accordingly, should it be desired to smooth the glass flim to allow a second level of interconnects to be formed over the glass film, the underlying aluminum melts. To avoid or reduce this problem, first level interconnects are often formed of some material other than aluminum selected to have a melting temperature above the flow temperature of the insulating glass formed over the interconnect leads. This often raises the impedance of the interconnects and slows the circuit.

SUMMARY

In accordance with this invention, a glass composition is provided which has a flow temperature near the melting point of aluminum. The term "flow temperature" is used here to indicate that temperature to which a glass film with a rough surface topography must be heated to produce substantial smoothing of the topography in thirty (30) minutes. In general, higher temperatures produce faster flow. This glass is thus suitable for use as insulation on an integrated circuit containing multiple levels of interconnects.

In accordance with this invention, a glass composition comprising a mixture of silicon, germanium, oxygen and phosphorus is provided which has the characteristic that it flows over integrated circuit interconnects made of a material such as aluminum or doped polycrystalline silicon by means of pressure coupled with temperature, temperature alone or a temperature pulse generated from a source such as a laser or a heat lamp (Xenon) to provide a smooth glass surface without damaging the underlying interconnect structure.

DESCRIPTION OF THE DRAWINGS

FIG. 1 illustrates the flow characteristics for the binary glass of this invention wherein the silicon dioxide and the germanium dioxide are arranged in 50—50 mole percent concentration, both with and without $P_2O_5$ added;

FIG. 3 is a graph illustrating the solubility in terms of angstroms per second of the binary $SiO_2$-$GeO_2$ glass in water at room temperature as a function of mole percent concentration of $GeO_2$ in the binary glass.

DETAILED DESCRIPTION

Figure 2:
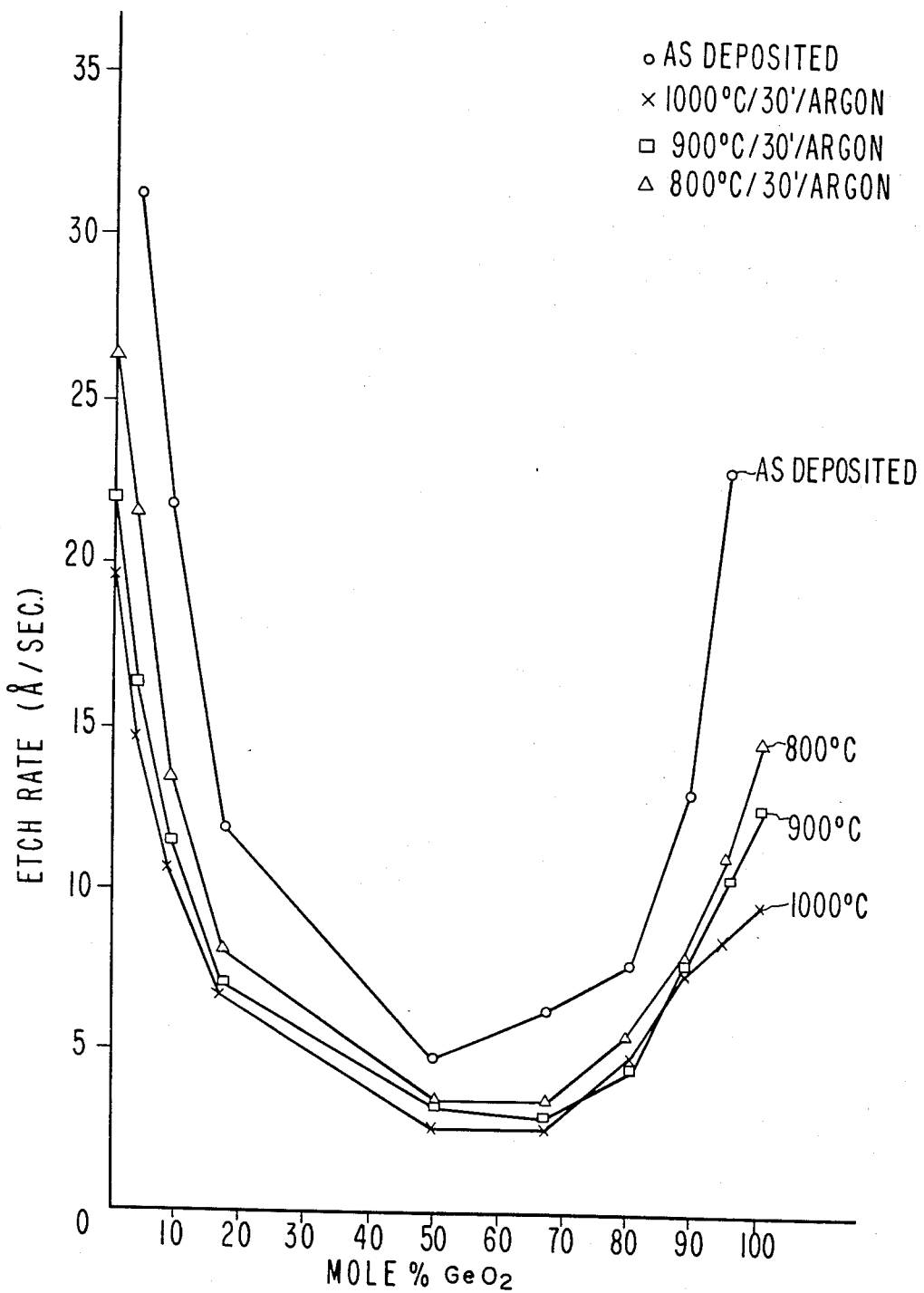
FIG. 2 illustrates the etch rate (angstroms per second) of the binary glass in a buffered HF etch as a function of the mole percent concentration of $GeO_2$ in the binary $SiO_2$-$GeO_2$ glass.

The glass of this invention comprises a mixture of silicon, germanium, oxygen, and phosphorus. The composition generally is in the range of approximately 30–70% $SiO_2$, 30–70% $GeO_2$, and 1–10% $P_2O_5$, by mole percent. Of course, the actual percentages of each constituent are such that the total of the mole percentages of all the constituents is 100%. By selecting the composition to be in these ranges, the flow temperature of the glass is brought low enough such that the surface of the glass can be reflowed without damaging the interconnects (such as aluminum or polysilicon) formed beneath the glass. The preferred range of constituents is 45–50% $SiO_2$:50–45% $GeO_2$: 1 to 5% $P_2O_5$ by mole percent, but we believe constituents in the range of 40–55% $SiO_2$:55–40% $GeO_2$:0 to 5% $P_2O_5$ by mole percent are also appropriate.

FIG. 1 illustrates the flow characteristics for the binary $GeO_2$-$SiO_2$ glass deposited in accordance with the teachings of this invention. The glass characterized by the graph of FIG. 1 comprises an $SiO_2$-$GeO_2$ glass in 50—50 mole percent of $SiO_2$ and $GeO_2$ both with and without phosphorous pentoxide ($P_2O_5$). The glass with phosphorous pentoxide contains five (5) mole percent of phosphorous pentoxide. FIG. 1 illustrates that during heat treatment for thirty (30) minutes in a nitrogen ambient, the glass with phosphorous pentoxide added flows heavily at a temperature slightly under 900° C. Heavy flow of the glass is obtained without phosphorcus pentoxide at a temperature of slightly under 1000° C. Moderate flows are obtained without phosphorous pentoxide at a temperature around 900° C. and with phosphorous pentoxide at a temperature just over 800° C. Thus phosphorus pentoxide in the glass reduces the temperature required to achieve a given flow.

FIG. 2 illustrates that the etch rate using a standard oxide etch (a buffered HF known in the art as a "500 etch") of the binary glass is a minimum when the mole concentration of $GeO_2$ in the binary $GeO_2$-$SiO_2$ glass is about fifty (50) percent. A change in the mole percent concentration of $GeO_2$ relative to $SiO_2$ in either direction about this point results in an increase in the etch rate of this glass. The various curves illustrate also the effect on the etch rate of first flowing the deposited glass at three different temperatures (1000° C. for 30 minutes in argon gas, 900° C. for 30 minutes in argon gas and 800° C. for 30 minutes in argon gas). While the flowing of the glass flattens the curve of etch rate versus mole percent $GeO_2$ at its minimum such that the minimum etch rate occurs for a mole percent $GeO_2$ between about 50-70 mole percent, the range of minimum etch rates still includes a mole percent of $GeO_2$ of about 50%.

FIG. 3 illustrates the water solubility at room temperature of the binary $GeO_2$-$SiO_2$ glass as a function of mole concentration of $GeO_2$. FIG. 3 shows that the water solubility (in terms of angstrom per second of glass removed in water) is approximately zero beneath a mole percent concentration of $GeO_2$ of 60%. Accordingly, the mole percentage of $GeO_2$ in the binary glass should not exceed 60% and preferably, for safety, should remain somewhat beneath this percentage. When FIG. 3 is compared to FIG. 2 giving the minimum etch rate of the binary glass, it is clear that a mole percentage of $GeO_2$ of about 50% in the binary glass is optimum because for maximum preciseness and control in the etching of vias through the binary glass, a binary glass with minimum etch rate is desirable. Moreover, FIG. 1 illustrates that a 50—50 mole percent $SiO_2$-$GeO_2$ binary glass has satisfactory flow characteristics for integrated circuit structures. Thus, a binary glass of about 50—50 mole percent $SiO_2$-$GeO_2$ is preferred for use in this invention.

In accordance with this invention, the use of a high pressure, as disclosed in co-pending application serial number 243,990 (filed on the same day as the parent application of this specification on an invention of Reda Razouk entitled "Method of Inducing Flow or Densification of Phosphosilicate Glass for Integrated Circuits" and assigned to Fairchild Camera and Instrument Corporation, the assignee of this application), can be used to further lower the flow temperature of the glass. The use of pressure to accelerate flow is desirable since the temperature window between the highest temperature to which an aluminum interconnect can be heated without damage (typically about 540° C. but in general dependant upon the aluminum alloy used) and the highest temperature used in subsequent processing is small. The glass flow point should be kept high enough to avoid flow of the glass during later processing for alloy cycles or die attach. For this reason the natural flow of glass is made to take place at a temperature quite close to that of the melting of aluminum alloys when aluminum is the interconnect material. In another approach using temperature pulse techniques involving lasers, a temperature difference between the glass and the underlying interconnect material can be sustained and the glass can be selectively reflowed at a localized temperature somewhat higher than the melting temperature of the interconnect (such as an aluminum alloy) without damaging the underlying interconnect structure.

The glass used here is similar in its properties to phosphosilicate glasses commonly used in the prior art but flows at a much lower temperature. While the prior art phosphosilicate glass flowed, it did so at a temperature much too high to allow it to be used over aluminum or organic dielectrics such as polyimide (which tends to absorb water).

EXAMPLE 1

A typical composition suitable for deposition over an interconnect structure comprising either aluminum, polysilicon or a polysilicide comprises a binary glass consisting of forty-nine (49) mole percent $SiO_2$, forty-nine (49) mole percent $GeO_2$ and two (2) mole percent $P_2O_5$ (corresponding to about 3.9 weight percent $P_2O_5$ in the resulting glass).

EXAMPLE 2

Typical deposition conditions using a Pyrox atmospheric CVD reactor made by Tempress involved the flow of germane ($GeH_4$), silane ($SiH_4$), oxygen ($O_2$), nitrogen ($N_2$) and phosphine ($PH_3$) in the Pyrox reactor at the following flow rates:

| Constituents | Flow Rates |
| --- | --- |
| $GeH_4$ | 3.67 cc/minute |
| $SiH_4$ | 7.33 cc/minute |
| $O_2$ | 100 cc/minute |
| $N_2$ | 2 liter/minute |
| $PH_3$ (1% in $N_2$) | 11 cc/minute |

The substrates on which the glass was deposited comprised patterned silicon wafers held at 400° C. The binary glass deposited at a rate of approximately 300 angstroms per minute.

The above description is exemplary only and other embodiments of this invention will be obvious to those skilled in the semiconductor glass arts in view of this disclosure.

What is claimed is:
1. An integrated circuit comprising:
   a semiconductor material;
   insulation formed on said semiconductor material;
   interconnect leads formed on said insulation and selectively brought into contact with the underlying semiconductor material through openings in said insulation; and
   a glass layer formed on said interconnect leads, said glass layer consisting of about 45% to 50% $SiO_2$, about 50% to 45% of $GeO_2$ and from 1% to about 5% of $P_2O_5$, by mole percent, said glass layer having a flow temperature sufficiently low to prevent damage to said leads and being capable of flowing over said leads at said flow temperature to provide a smooth glass layer surface.
2. An integrated circuit as in claim 1 wherein said glass layer has a substantially smooth surface.
3. An integrated circuit as in claim 1, wherein said interconnect leads comprise aluminum.
4. An integrated circuit as in claim 1, wherein said interconnect leads comprise polycrystalline silicon selectively doped to a desired conductivity.
5. In combination a low temperature insulating glass and an interconnect structure of a semiconductor device, said insulating glass consisting of about 45% to 50% $SiO_2$, about 50% to 45% $GeO_2$ and 1 to 5% of $P_2O_5$, all by mole percent, wherein said glass has a flow temperature under 1000° C. for smoothing said glass while preventing damage to said interconnect structure and wherein said glass is deposited on said structure by chemical vapor deposition at a temperature less than the flow temperature.
6. In combination a low-temperature insulating glass and an interconnect structure of a semiconductor device, said insulating glass consisting of about 45% to 50% $SiO_2$, about 50% to 45% $GeO_2$, and about 5% $P_2O_5$, all by mole percent, wherein said glass has a flow temperature under 1000° C. for smoothing said glass while preventing damage to said interconnect structure and wherein said glass is deposited on said structure by chemical vapor deposition.

* * * * *